(12) United States Patent
Ko et al.

(10) Patent No.: US 11,551,930 B2
(45) Date of Patent: Jan. 10, 2023

(54) METHODS TO RESHAPE SPACER PROFILES IN SELF-ALIGNED MULTIPLE PATTERNING

(71) Applicant: Tokyo Electron Limited, Tokyo (JP)

(72) Inventors: Akiteru Ko, Albany, NY (US); Kazuya Okubo, Tokyo (JP); Hiroyuki Toshima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 37 days.

(21) Appl. No.: 16/299,623

(22) Filed: Mar. 12, 2019

(65) Prior Publication Data
US 2020/0194261 A1 Jun. 18, 2020

Related U.S. Application Data

(60) Provisional application No. 62/778,794, filed on Dec. 12, 2018.

(51) Int. Cl.
*H01L 21/00* (2006.01)
*H01L 21/033* (2006.01)
(Continued)

(52) U.S. Cl.
CPC .... *H01L 21/0337* (2013.01); *H01L 21/02274* (2013.01); *H01L 21/31116* (2013.01); *H01L 21/31144* (2013.01)

(58) Field of Classification Search
CPC .......... H01L 21/00; H01L 23/00; H01L 27/00
See application file for complete search history.

(56) References Cited

U.S. PATENT DOCUMENTS

2006/0194396 A1* 8/2006 Sunil ................. H01L 21/67207
438/287
2015/0287612 A1* 10/2015 Luere ................. H01L 21/3086
438/703
(Continued)

OTHER PUBLICATIONS

Chao et al., Multitechnique Metrology Methods for Evaluating Pitch Walking in 14 nm and Beyond FinFETs, Journal of Micro/Nanolithography, MEMS, and MOEMS 13(4) 041411, Oct. 29, 2014.

*Primary Examiner* — Gordon Baldwin
*Assistant Examiner* — Mohammad Mayy
(74) *Attorney, Agent, or Firm* — Wood Herron & Evans LLP (57) ABSTRACT

Embodiments are described herein to reshape spacer profiles to improve spacer uniformity and thereby improve etch uniformity during pattern transfer associated with self-aligned multiple-patterning (SAMP) processes. For disclosed embodiments, cores are formed on a material layer for a substrate of a microelectronic workpiece. A spacer material layer is then formed over the cores. Symmetric spacers are then formed adjacent the cores by reshaping the spacer material layer using one or more directional deposition processes to deposit additional spacer material and using one or more etch process steps. For one example embodiment, one or more oblique physical vapor deposition (PVD) processes are used to deposit the additional spacer material for the spacer profile reshaping. This reshaping of the spacer profiles allows for symmetric spacers to be formed thereby improving etch uniformity during subsequent pattern transfer processes.

25 Claims, 7 Drawing Sheets

(51) Int. Cl.
*H01L 21/311* (2006.01)
*H01L 21/02* (2006.01)

(56) References Cited

U.S. PATENT DOCUMENTS

| | | | |
|---|---|---|---|
| 2016/0027655 A1* | 1/2016 | Chen | C23C 16/345 |
| | | | 438/703 |
| 2016/0104613 A1* | 4/2016 | Takeshita | H01L 21/02274 |
| | | | 438/703 |
| 2018/0076035 A1* | 3/2018 | Bergendahl | H01L 21/0337 |
| 2018/0247938 A1* | 8/2018 | Cheng | H01L 27/0886 |

* cited by examiner

METHODS TO RESHAPE SPACER PROFILES IN SELF-ALIGNED MULTIPLE PATTERNING

RELATED APPLICATIONS

This application claims priority to the following provisional application: U.S. Provisional Patent Application Ser. No. 62/778,794, filed Dec. 12, 2018, and entitled "METHODS TO RESHAPE SPACER PROFILES IN SELF-ALIGNED MULTIPLE PATTERNING," which is hereby incorporated by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Self-aligned multiple patterning (SAMP) processes, such as self-aligned double patterning (SADP) processes and self-aligned quadruple patterning (SAQP), have been developed to reduce feature sizes beyond what is directly achievable by lithography processes. For some SAMP processes and particularly for SADP processes, spacers are typically formed as side wall structures adjacent cores on a substrate being processed, and the core material is later removed. This core removal process is typically called a mandrel pull and is often performed by a plasma etch process such as a reactive ion etch (RIE) process.

For prior SAMP processes, the height of the spacers after the mandrel pull process are typically different with respect to the portions of the spacers adjacent to the cores and the portions of the spacers adjacent the gaps between the cores. This asymmetric shape of the spacers degrades etch uniformity and introduces gouging differences during later etch processes. For example, these asymmetric shapes often cause gouging differences to form between portions of an underlying material layer below the removed cores and portions of the underlying material layer below the gaps between the cores. This degradation occurs, for example, when the patterned formed by the spacers is transferred through an etch process to an underlying layer, such as a hard mask layer.

Figure 1:
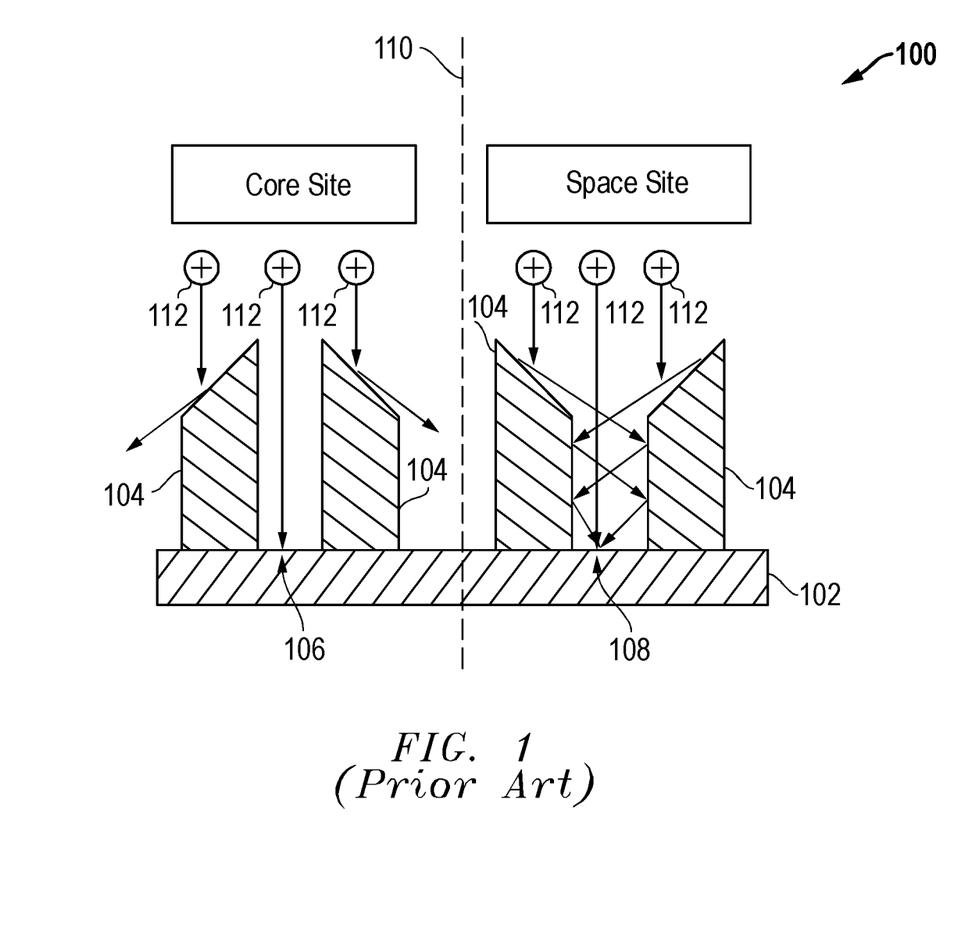
FIG. 1 (Prior Art) provides a cross-section view of an example embodiment for prior solutions where degradation of etch uniformity is caused in subsequent pattern transfer due to the asymmetric shape of the top portions of spacers that remain after the mandrel pull within a SAMP process.

FIG. 1 (Prior Art) provides a cross-section view of an example embodiment 100 for prior solutions where degradation of etch uniformity is caused in subsequent pattern transfer due to the asymmetric shape of the top portions of spacers 104 that remain after the mandrel pull within a SAMP process. The asymmetric shape of the spacers 104 and resulting degradation in etch uniformity can introduce deterioration of line edge roughness (LER) and line width roughness (LWR) parameters. The asymmetric spacer shape also tends to cause pitch walking due to the deterioration of gouging depth within the underlying layers.

Looking to example embodiment 100, cores have been removed from between spacers 104 using a mandrel pull process. The spacers 104 were previously formed on a substrate 102, which can include one or more material layers. The mandrel pull process leaves core sites 106 and space sites 108 associated with the spacers 104. An example core site 106 is shown to the left of dashed line 110, and an example space site 108 is shown to the right of dashed line 110. As shown, the spacers 104 left after the mandrel pull process have asymmetric top portions. In particular, the edges of the spacers 104 on the sides adjacent a core site 106 where a core has been pulled are higher than the edges of the spacers 104 on the sides adjacent a space site 108 where there were gaps between the cores.

During subsequent etch processing, such as plasma etch processing, particles 112 associated with the etch chemistry are delivered to the substrate 102. However, the delivery of these particles 112 to the substrate 102 will be affected by the asymmetric top portions of the spacers 104. For example, particles 112 delivered to the space site 108 will be redirected into the region between the spacers 104, and particles delivered to the core site 106 will be redirected away from the region between the spacers 104. As such, the surface for an underlying layer within the substrate 102 associated with the space site 108 will be etched more quickly than the surface for an underlying layer associated with a core site 106. This uneven etching will lead to undesired variations in etch profiles.

FIGS. 2A-D (Prior Art) provide cross-section views of an example embodiment where asymmetric spacers lead to lack of etch uniformity in prior solutions.

Figure 2A:
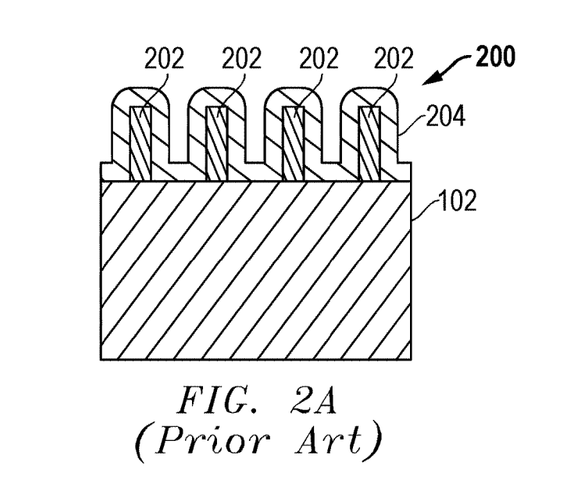
FIGS. 2A-D (Prior Art) provide cross-section views of an example embodiment where asymmetric spacers lead to lack of etch uniformity in prior solutions.

FIG. 2A (Prior Art) provides a cross-section view of an example embodiment 200 after a spacer material layer 204 has been deposited over cores 202. The cores 202 were previously formed over the substrate 102, which can include one or more material layers. The spacer material layer 204 can be an oxide layer ($SiO_2$), a nitride layer (SiN), and/or other protective material layer that is formed over the cores 202. For one example embodiment, the spacer material layer 204 is deposited using atomic layer deposition (ALD) and/or other deposition techniques. The cores 202 can be formed as an organic planarization layer (OPL), an amorphous silicon layer, and/or another material layer.

Figure 2B:
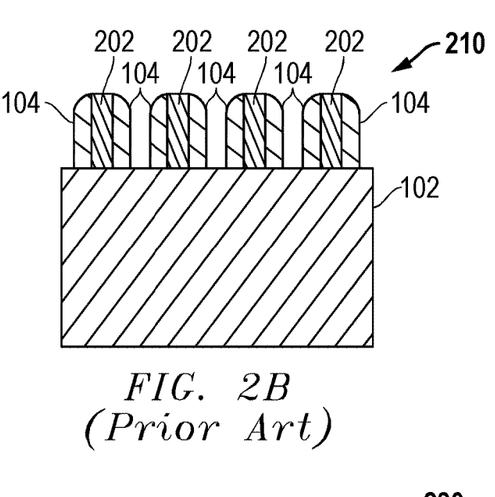

FIG. 2B (Prior Art) provides a cross-section view of an example embodiment 210 after an etch back process has been performed. For example, an etch back process is performed to etch the spacer material layer 204 and form spacers 104 along the side walls of the cores 202. The etch back process can be, for example, a plasma etch process.

Figure 2C:
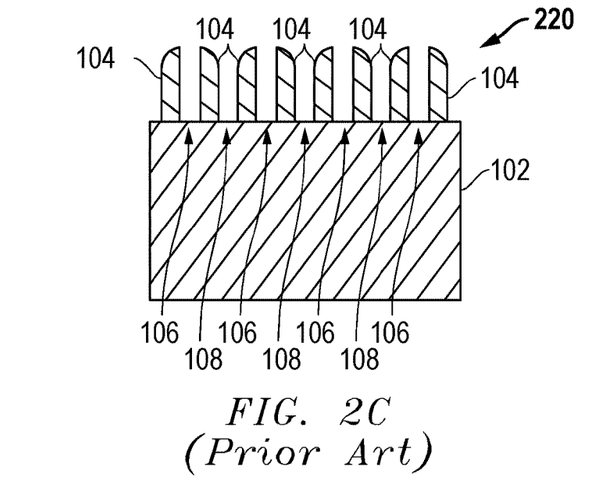

FIG. 2C (Prior Art) provides a cross-section view of an example embodiment 220 after a mandrel pull process has been performed. As shown, the mandrel pull process, such as an ash process where the cores 202 are formed from an OPL, is used to remove the cores 202 shown in FIG. 2B (Prior Art). After this mandrel pull process, spacers 104 are left that have asymmetric top portions. In particular, the edges of the spacers 104 on the sides adjacent to core sites 106 where cores 202 were pulled are higher than the edges of the spacers 104 on the sides adjacent to space sites 108 where there were gaps between the cores 202 as shown in FIG. 2B (Prior Art).

Figure 2D:
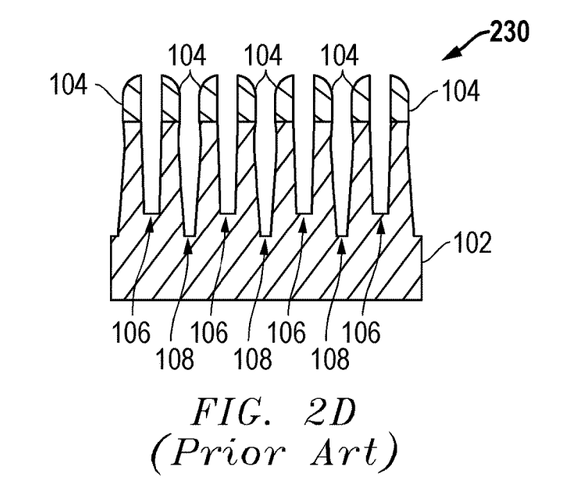

FIG. 2D (Prior Art) provides a cross-section view of an example embodiment 230 after an etch process has been applied to transfer the pattern for the spacers 104 to the substrate 102 between the spacers 104. The asymmetric shapes of the spacers 104 cause degradation in etch uniformity and uneven gouging in the underlying material layer within the substrate 102 as described with respect to FIG. 1 (Prior Art). As shown in FIG. 2D (Prior Art), differences in etch uniformity leaves surfaces associated with core sites 106 having different resulting etch levels as compared to surfaces associated with the space sites 108. Thus, etch uniformity is degraded giving rise to various potential problems as described above.

SUMMARY

Embodiments are described herein to reshape spacer profiles to improve spacer uniformity and thereby improve etch uniformity during pattern transfer associated with self-aligned multiple-patterning (SAMP) processes. The reshaping is providing by depositing additional spacer material to corners of spacers adjacent cores and/or corners of a spacer material layer that covers cores that have formed, for example, as part of a SAMP process. For one example embodiment, one or more directional deposition processes, such as oblique physical vapor deposition (PVD) processes, are used to reshape the spacer profiles. This reshaping of the spacer profiles allows for symmetric spacers to be formed thereby improving etch uniformity during subsequent pattern transfer processes. Different or additional features, variations, and embodiments can also be implemented, and related systems and methods can be utilized as well.

For one embodiment, a method to reshape spacer profiles is disclosed including forming cores on a material layer for a substrate of a microelectronic workpiece, forming a spacer material layer over the cores, and forming symmetric spacers adjacent the cores by reshaping the spacer material layer using one or more directional deposition processes to deposit additional spacer material and using one or more etch process steps.

In additional embodiments, the symmetric spacers are formed as part of a self-aligned multiple patterning (SAMP) process. In further embodiments, the symmetric spacers are formed by depositing, with the one or more directional deposition processes, additional spacer material to corners of the spacer material layer where the spacer material layer covers corners of the cores and by etching, with the one or more etch processes, the spacer material layer and the additional spacer material to leave symmetric spacers adjacent the cores. In still further embodiments, the corners of the spacer material layer are rounded corners.

In additional embodiments, the symmetric spacers are formed by etching the spacer material layer to form asymmetric spacers adjacent the cores, by depositing additional spacer material to corners of the spacers with the one or more directional deposition processes, and by etching the additional spacer material to leave symmetric spacers adjacent the cores with the one or more etch processes. In further embodiments, the corners of the asymmetric spacers have rounded corners.

In additional embodiments, the method includes using a planarization process at least in part to form the symmetric spacers. In further embodiments, the spacer material layer and the additional spacer material are a common material. In still further embodiments, the spacer material layer and the additional spacer material are different materials.

In additional embodiments, the one or more directional deposition processes include one or more oblique physical vapor deposition (PVD) processes. In further embodiments, the one or more oblique PVD processes apply the additional spacer material at an angle of 30 to 60 degrees. In further embodiments, the one or more oblique PVD processes apply the additional spacer material at an angle of 45 degrees.

In additional embodiments, the one or more oblique PVD processes are used to deposit additional spacer material simultaneously in two different directions. In further embodiments, a first set of one or more oblique PVD processes is used to deposit additional spacer material in a first direction and a second set of one or more oblique PVD processes is used to deposit additional spacer material in a second direction. In still further embodiments, oblique PVD processes from the first set are alternated with oblique PVD processes from the second set.

In additional embodiments, a plurality of oblique physical vapor deposition (PVD) processes are used having at least one of a same process chemistry, a different process chemistry, or a combination thereof. In further embodiments, a plurality of oblique physical vapor deposition (PVD) processes are used having at least one of a same target material, a different target material, or a combination thereof.

In additional embodiments, the method also includes removing the cores to leave the symmetric spacers. In further embodiments, the method includes transferring a pattern for the symmetric spacers to the material layer. In still further embodiments, a target level of etch uniformity is achieved in the transferring of the pattern.

In additional embodiments, he spacer material layer includes at least one of an oxide or a nitride, and the additional spacer material includes at least one of an oxide or a nitride. In further embodiments, the cores are formed from at least one of an organic planarization layer or an amorphous silicon layer. In still further embodiments, the spacer material layer is formed using atomic layer deposition.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, etch uniformity is improved for the manufacture of microelectronic workpieces by reshaping spacer profiles with additional spacer material using one or more directional deposition processes. Embodiments include depositing additional spacer material to corners of spacers adjacent cores, to corners of a spacer material layer that covers cores formed as part of a SAMP process, and/or other implementations that reshape spacer profiles using directional deposition processes. For one embodiment, the one or more directional deposition processes include oblique physical vapor deposition (PVD) processes that are used to deposit the additional spacer material. Once the spacer profiles are reshaped, an etch back process is performed to etch back the spacer material layers and/or the additional spacer material in order to leave symmetric spacers adjacent the cores. A planarization process can also be used in the formation of the symmetric spacers. After cores are pulled, these symmetric spacers are used to transfer a pattern to underlying layers without suffering from the etch uniformity degradation experienced by prior solutions. The reshaping embodiments described herein are able to achieve a target level of etch uniformity and/or a target level of gouging in this pattern transfer to one or more underlying material layers. Other advantages and implementations can also be achieved while still taking advantage of the process techniques described herein.

FIGS. 3A-3E provide cross-section views of an example embodiment where spacer material layers are reshaped to reduce or eliminate degradation in etch uniformity experienced by prior solutions. For this example embodiment, the spacer material layers are reshaped by depositing additional spacer material to corners of a spacer material layer using one or more directional deposition processes, such as oblique PVD processes. This reshaping then allows for the formation of symmetric spacers thereby reducing or eliminating degradation in etch uniformity experienced by prior solutions.

Figure 3A:
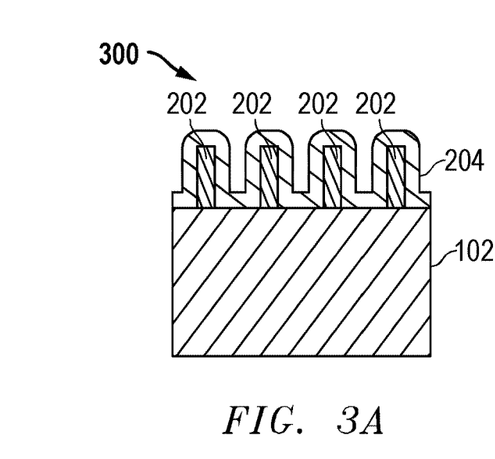
FIGS. 3A-3F provide cross-section views of an example embodiment where spacer material layers are reshaped by depositing additional spacer material to corners of a spacer material layer using directional deposition processes thereby reducing or eliminating degradation in etch uniformity experienced by prior solutions.

FIG. 3A provides a cross-section view of an example embodiment 300 after a spacer material layer 204 has been formed over cores 202, which were previously formed over a substrate 102. The substrate 102 can include one or more material layers. The spacer material layer 204 can be an oxide layer ($SiO_2$), a nitride layer (SiN), and/or other protective material layer that is formed over the cores 202. For one example embodiment, the spacer material layer 204 is formed using atomic layer deposition (ALD) and/or other deposition techniques. The cores 202 can be formed from an OPL, an amorphous silicon layer, and/or another material layer.

Figure 3B:
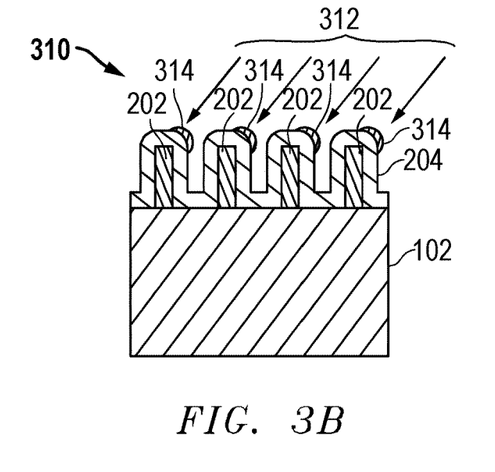

FIG. 3B provides a cross-section view of an example embodiment 310 after one or directional deposition processes have been performed to deposit additional spacer material 314. This additional spacer material 314 is deposited on the corners of the spacer material layer 204 where it covers the corners on one side of the cores 202. For embodiment 310, the additional spacer material 314 is being deposited on the top right corners of the spacer material layer 204 as indicated by arrows 312. As shown for embodiment 310, these corners where the additional spacer material 314 is deposited can be rounded corners. The additional spacer material 314 can be the same material as the spacer material layer 204 or can be a different material from the spacer material layer 204.

Figure 3C:
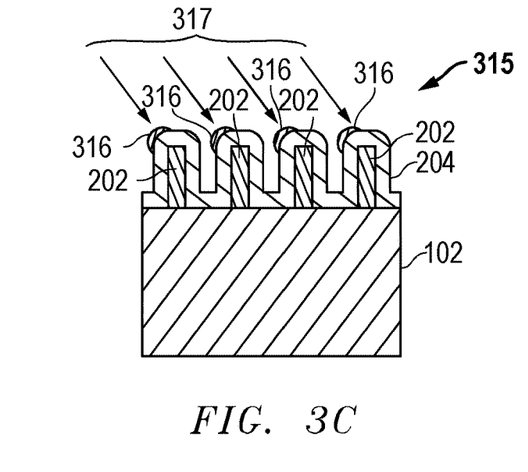

FIG. 3C provides a cross-section view of an example embodiment 315 after one or directional deposition processes have been performed to deposit additional spacer material 316. This additional spacer material 316 is deposited on the corners of the spacer material layer 204 where it covers the corners one the other side of the cores 202. For embodiment 315, the additional spacer material 316 is deposited on the top left corners of the spacer material layer 204 as indicated by arrows 317. As shown for embodiment 315, these corners where the additional spacer material 316 is deposited can be rounded corners. The additional spacer materials 314/316 can be, for example, oxide, nitride, and/or other protective material. The additional spacer material 316 can be the same material as the spacer material layer 204 or can be a different material from the spacer material layer 204. Further, directional deposition processes used to form the additional spacer materials 314/316 can be implemented using the same process chemistry, using different processing chemistry, or combinations thereof. Still further, the target material of the deposition processes used to form the additional spacer materials 314/216 can also be the same, different, or combinations thereof. Other variations can also be implemented while still taking advantage of the techniques described herein.

It is noted that the additional spacer material 314 is shown as being formed before the additional spacer material 316 in FIGS. 3B-C. It is further noted that additional spacer material 316 can be formed before the additional spacer material 314. In addition, additional spacer materials 314/316 can be deposited using directional deposition processes that alternate directions. For example, a first set of directional deposition processes are used to deposit the additional spacer material 314 using one angle, and a second set of directional deposition processes are used to deposit the additional spacer material 316. In addition, deposition processes within the first set and with the second set are alternated to build the additional spacer materials 314/316 over multiple alternating process cycles. This alternating technique helps to avoid shadowing that can occur, for example, if one of the spacer materials 314/316 is fully formed before the other is formed.

For one example embodiment, one or more oblique physical vapor deposition (PVD) processes are used as the directional deposition processes to deposit the additional spacer material 314 shown in FIG. 3B and the additional spacer material 316 shown in FIG. 3C. For example, one or more oblique PVD processes can be used to apply additional spacer material 314 to the top right corners of the spacer material layer 204, and one or more similar oblique PVD processes can also be used to apply additional spacer material 316 to the top left corners of the spacer material layer 204. The oblique PVD processes can deposit the additional spacer materials 314/316, for example, at an angle of 30 to 60 degrees and preferably at an angle of 45 degrees. Although separate oblique PVD processes are shown with respect to FIG. 3B and FIG. 3C, it is noted that one or more oblique PVD processes could also be used to apply the additional spacer materials 314/316 simultaneously to both corners of the spacer material layer 204. Further, as indicated above, oblique PVD processes can be used that alternate directions to build the additional spacer materials 314/316 in with an alternating technique over multiple, alternating process cycles. In addition, the oblique PVD processes can be implemented using the same process chemistry, using different processing chemistry, or combinations thereof. Further, the target material of the PVD processes used to form the additional spacer materials 314/216 can also be the same, different, or combinations thereof. Still further, other directional deposition processes could also be used instead of or in addition to one or more oblique PVD processes. Other variations can also be implemented while still taking advantage of the techniques described herein.

Figure 3D:
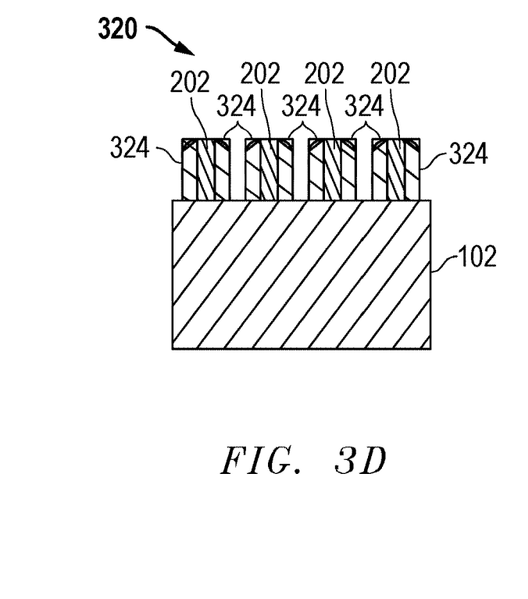

FIG. 3D provides a cross-section view of an example embodiment 320 after a portion of the spacer material layer 204 and the additional spacer materials 314/316 has been removed to form symmetric spacers 324 adjacent the cores 202. For example, an etch back process can be performed to etch back the spacer material layer 204 and the additional spacer materials 314/316 in order to leave symmetric spacers 324 along the side walls of the cores 202. For one example embodiment, a planarization process is performed to planarize the spacer material layer 204 along with the top surface of the cores 202 and the additional spacer material 314 as part of the formation of the symmetric spacers 324. It is also noted that an etch back process and a planarization could be used in combination. Different and/or additional processes could also be used to form the symmetric spacers 324 after the reshaping provided in FIGS. 3B-C.

Figure 3E:
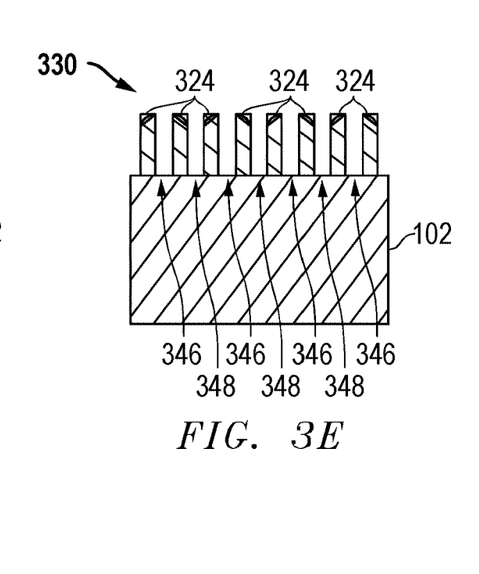

FIG. 3E provides a cross-section view of an example embodiment 330 after a mandrel pull process has been performed. As shown, the mandrel pull process, such as an ash process where the cores 202 are formed from an OPL, is used to remove the cores 202 shown in FIG. 3D. After this mandrel pull process, symmetric spacers 324 are left. In particular, the edges of the symmetric spacers 324 on the sides adjacent to core sites 346 where cores 202 were pulled have similar or matching levels as compared to the edges of the symmetric spacers 324 on the sides adjacent to space sites 348 where there were gaps between the cores 202 as shown in FIG. 3D. In contrast with prior solutions, these symmetric spacers 324 are uniform and provide symmetric top portions.

Figure 3F:
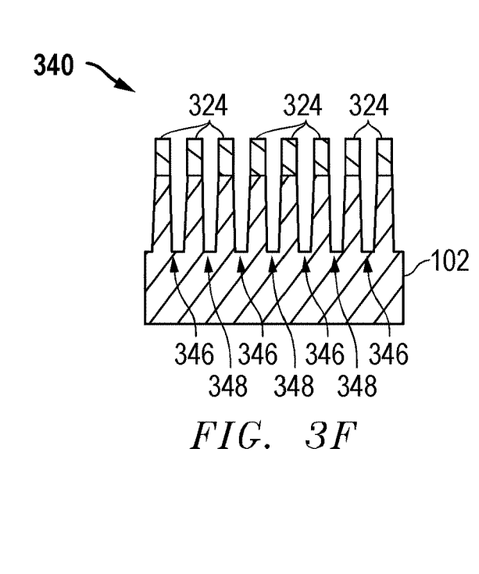

FIG. 3F provides a cross-section view of an example embodiment 340 after an etch process has been applied to transfer the pattern for the symmetric spacers 324 to the substrate 102 between the symmetric spacers 324. The substrate 102 can include one or more material layers upon which the cores 202 were previously formed as shown in FIG. 3A. The symmetric shapes of the spacers 324 alleviate the problems associated with the asymmetric spacers generated by prior solutions, thereby improving etch uniformity. In particular, as shown in embodiment 340, etch uniformity is improved so that surfaces associated with core sites 346 have similar or matching etch levels as compared to surfaces associated with space sites 348. Thus, etch uniformity is improved thereby reducing or eliminating problems experienced in prior solutions. Further, the reshaping embodiments described herein are able to achieve a target level of etch uniformity and/or a target level of gouging in the pattern transfer to one or more underlying material layers as shown in FIG. 3F due to the reshaping of spacer profiles and formation of symmetric spacers as described herein.

FIGS. 4A-4D provide cross-section views of an additional example embodiment where spacer material layers are reshaped to reduce or eliminate degradation in etch uniformity experienced by prior solutions. For this example embodiment, the spacer material layers are reshaped by depositing additional spacer material to corners of spacers using one or more directional deposition processes such as oblique PVD processes. This reshaping then allows for the formation of symmetric spacers thereby reducing or eliminating degradation in etch uniformity experienced by prior solutions.

Figure 4A:
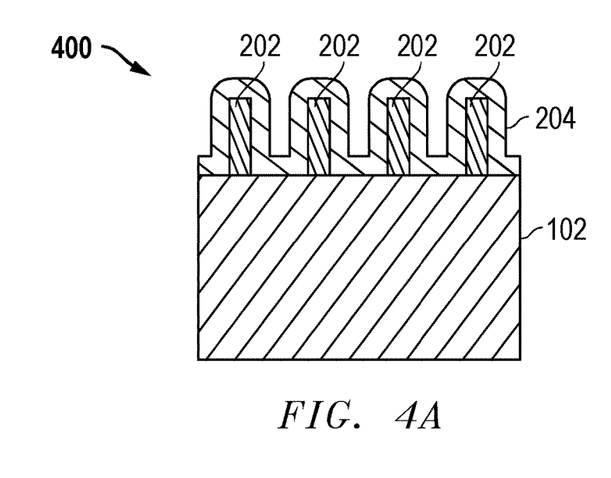
FIGS. 4A-D provide cross-section views of an additional example embodiment where spacer material layers are reshaped by depositing additional spacer material to corners of spacers using directional deposition processes thereby reducing or eliminating degradation in etch uniformity experienced by prior solutions.

FIG. 4A provides a cross-section view of an example embodiment 400 after a spacer material layer 204 has been formed over cores 202, which were previously formed over a substrate 102. The substrate 102 can include one or more material layers. The spacer material layer 204 can be an oxide layer ($SiO_2$), a nitride layer (SiN), and/or other protective material layer that is formed over the cores 202. For one example embodiment, the spacer material layer 204 is formed using atomic layer deposition (ALD) and/or other deposition techniques. The cores 202 can be formed from an OPL, an amorphous silicon layer, and/or another material layer. It is noted that embodiment 400 matches embodiment 300 of FIG. 3A.

Figure 4B:
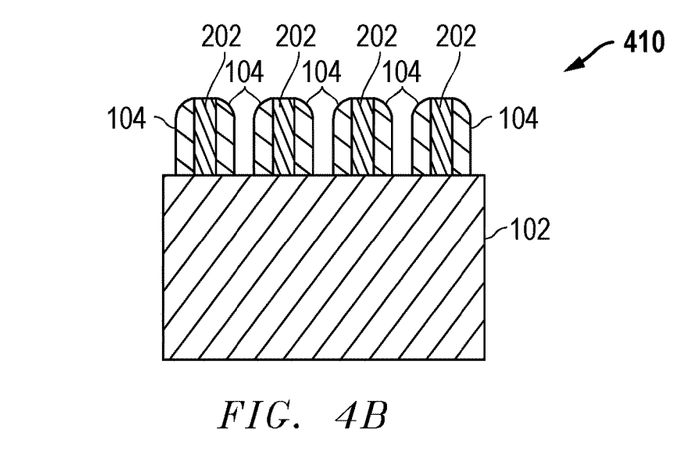

FIG. 4B provides a cross-section view of an example embodiment 410 after an etch back process has been performed. For example, an etch back process is performed to etch the spacer material layer 204 shown in FIG. 4A and to form spacers 104 along the side walls of the cores 202 as shown for example embodiment 410 in FIG. 4B. The etch back process can be, for example, a plasma etch process.

Figure 4C:
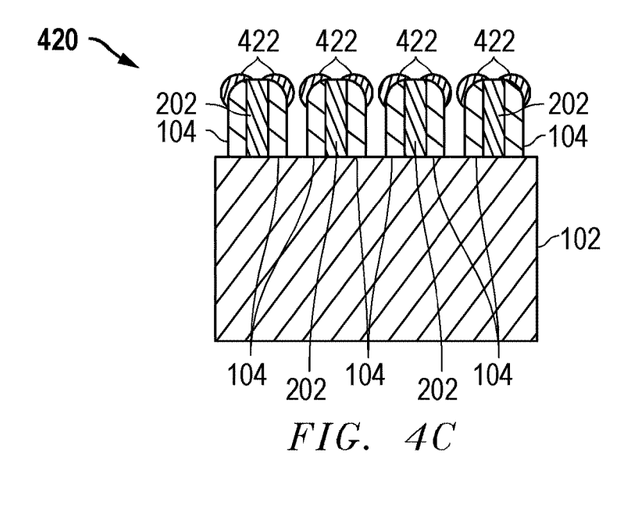

FIG. 4C provides a cross-section view of an example embodiment 420 after one or directional deposition processes have been performed to deposit additional spacer material 422. This additional spacer material 422 is deposited on the corners of the spacers 104 that are adjacent the cores 202. For embodiment 420, these corners are rounded corners. As described above the one or more directional deposition processes can be one or more oblique PVD processes. For some embodiments as described above, the one or more oblique PVD processes can be used to deposit additional spacer material simultaneously in two different directions to deposit the additional spacer material 422 on spacers on both sides of the cores at the same time. For additional embodiments, a first set of one or more oblique PVD processes can be used to deposit additional spacer material 422 in a first direction for a first set of corners, and a second set of one or more oblique PVD processes can be used to deposit additional spacer material in a second direction for a second set of corners. Other variations can also be implemented.

Figure 4D:
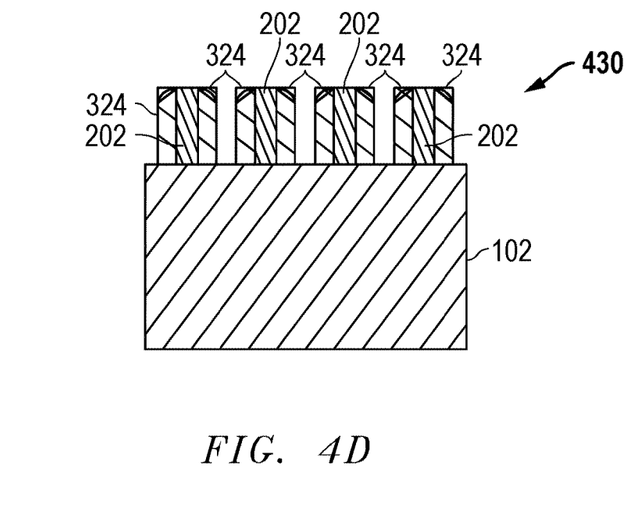

FIG. 4D provides a cross-section view of an example embodiment 430 after the additional spacer material 422 has been etched to form symmetric spacers 324 adjacent the cores 202. For example, an etch back process can be performed to etch back the additional spacer material 422 as well as the spacer material layer 204 as needed in order to leave symmetric spacers 324 along the side walls of the cores 202. For one example embodiment, a planarization process can also performed to planarize the spacer material layer 204 along with the top surface of the cores 202 and the additional spacer material 422 in order to form or facilitate the formation of the symmetric spacers 324. It is also noted that an etch back process and a planarization could be used in combination. Different and/or additional processes could also be used to form the symmetric spacers 324 after the reshaping provided in FIG. 4C. It is also noted that embodiment 430 matches embodiment 320 of FIG. 3D, and the processes of FIGS. 3E-F can similarly be used to further process embodiment 430 in FIG. 4D.

Figure 5A:
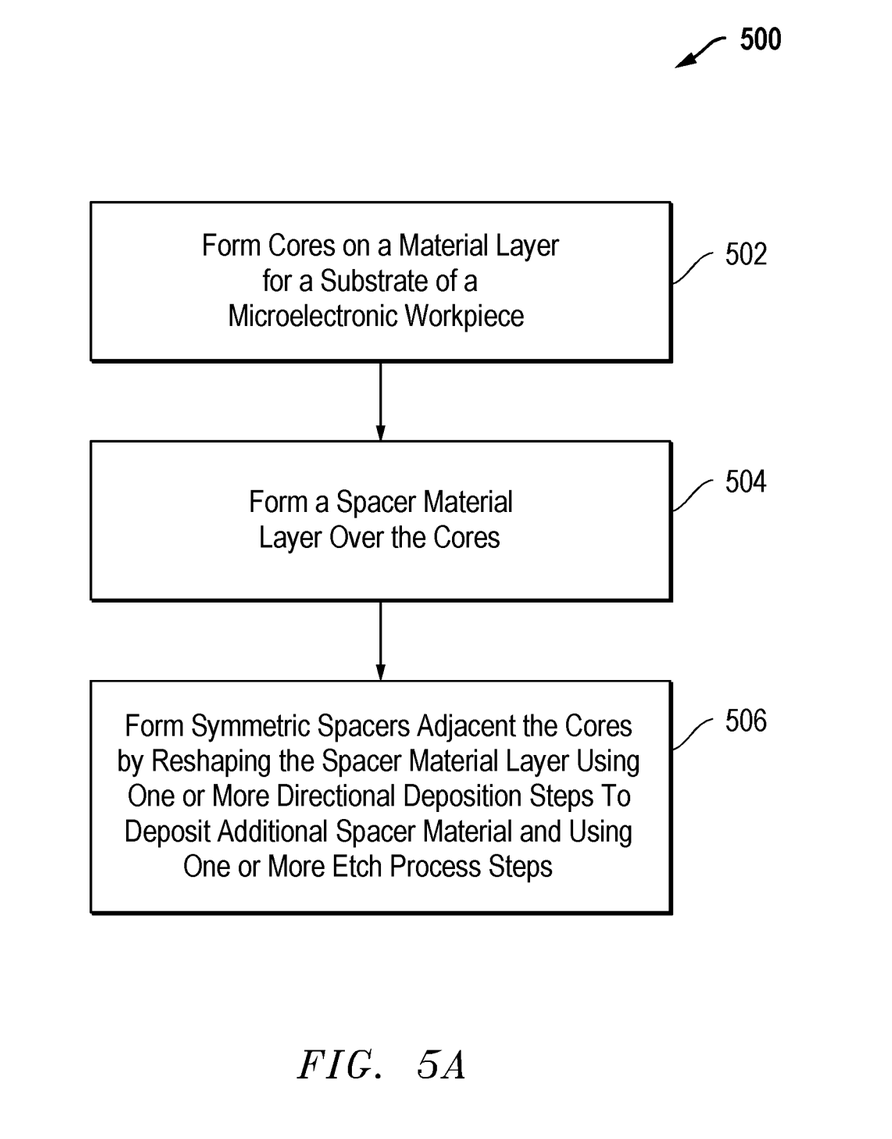
FIG. 5A is a process flow diagram of an example embodiment that provides reshaping of spacer profiles by depositing additional spacer material using direction deposition processes.

FIG. 5A is a process flow diagram of an example embodiment 500 that provides reshaping of spacer profiles by depositing additional spacer material using direction deposition processes. In block 502, cores are formed on a material layer for a substrate of a microelectronic workpiece. In block 504, a spacer material layer is formed over the cores. In block 506, symmetric spacers are formed adjacent the cores by reshaping the spacer material layer using one or more directional deposition processes to deposit additional spacer material and using one or more etch process steps. It is noted that additional and/or different steps could also be used while still taking advantage of the techniques described herein.

Figure 5B:
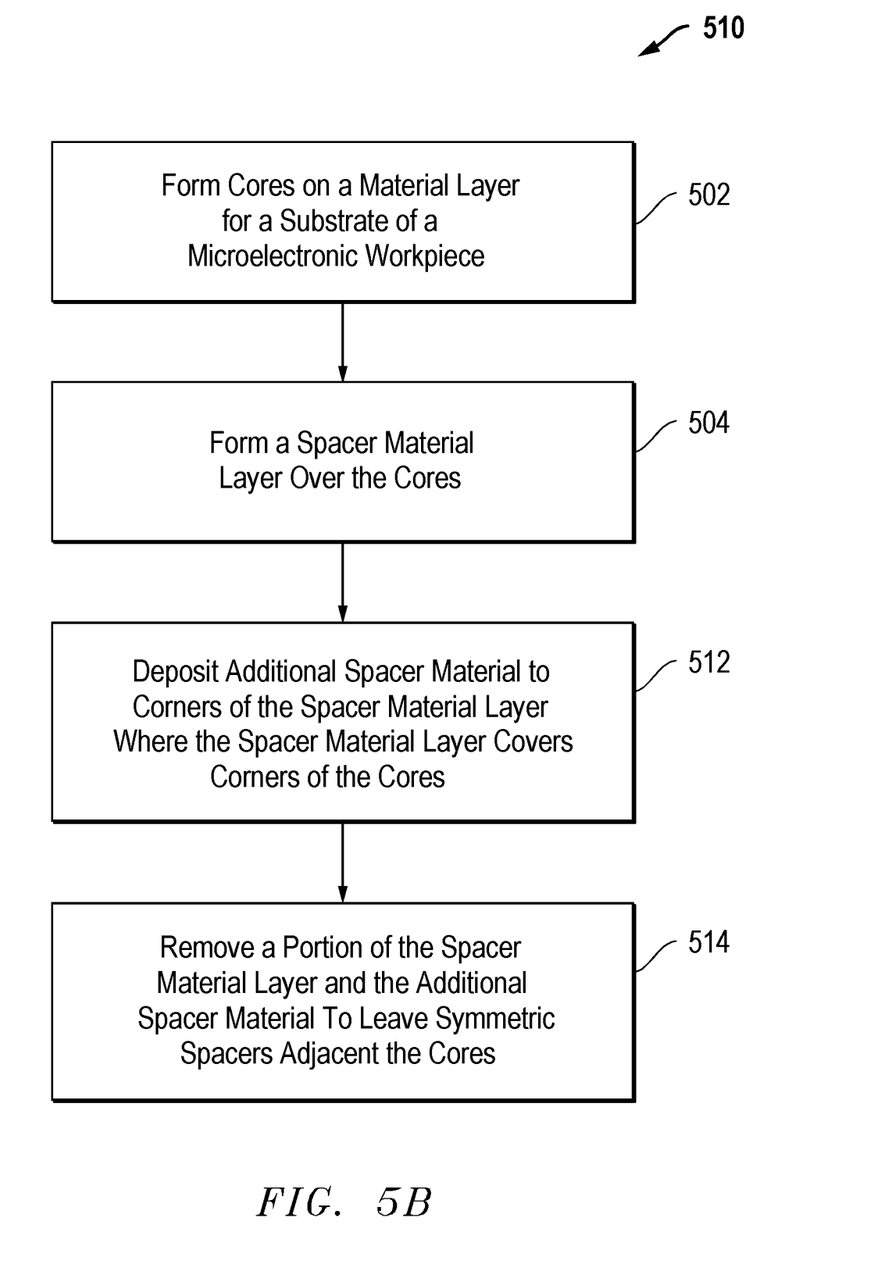
FIG. 5B is a process flow diagram of an example embodiment that provides reshaping of spacer profiles by depositing additional spacer material to corners of a spacer material layer using direction deposition processes.

FIG. 5B is a process flow diagram of an example embodiment 510 that provides reshaping of spacer profiles by depositing additional spacer material to corners of a spacer material layer using direction deposition processes. Blocks 502 and 504 are the same as in FIG. 5A. For block 502, cores are formed on a material layer for a substrate of a microelectronic workpiece. For block 504, a spacer material layer is formed over the cores. For embodiment 510, the symmetric spacers are formed in blocks 512 and 514. For block 512, additional spacer material is deposited to corners of the spacer material layer where the spacer material layer covers corners of the cores using one or more directional deposition processes. In block 514, a portion of the spacer material layer and the additional spacer material are removed to leave symmetric spacers adjacent the cores. It is noted that additional and/or different steps could also be used while still taking advantage of the techniques described herein.

Figure 5C:
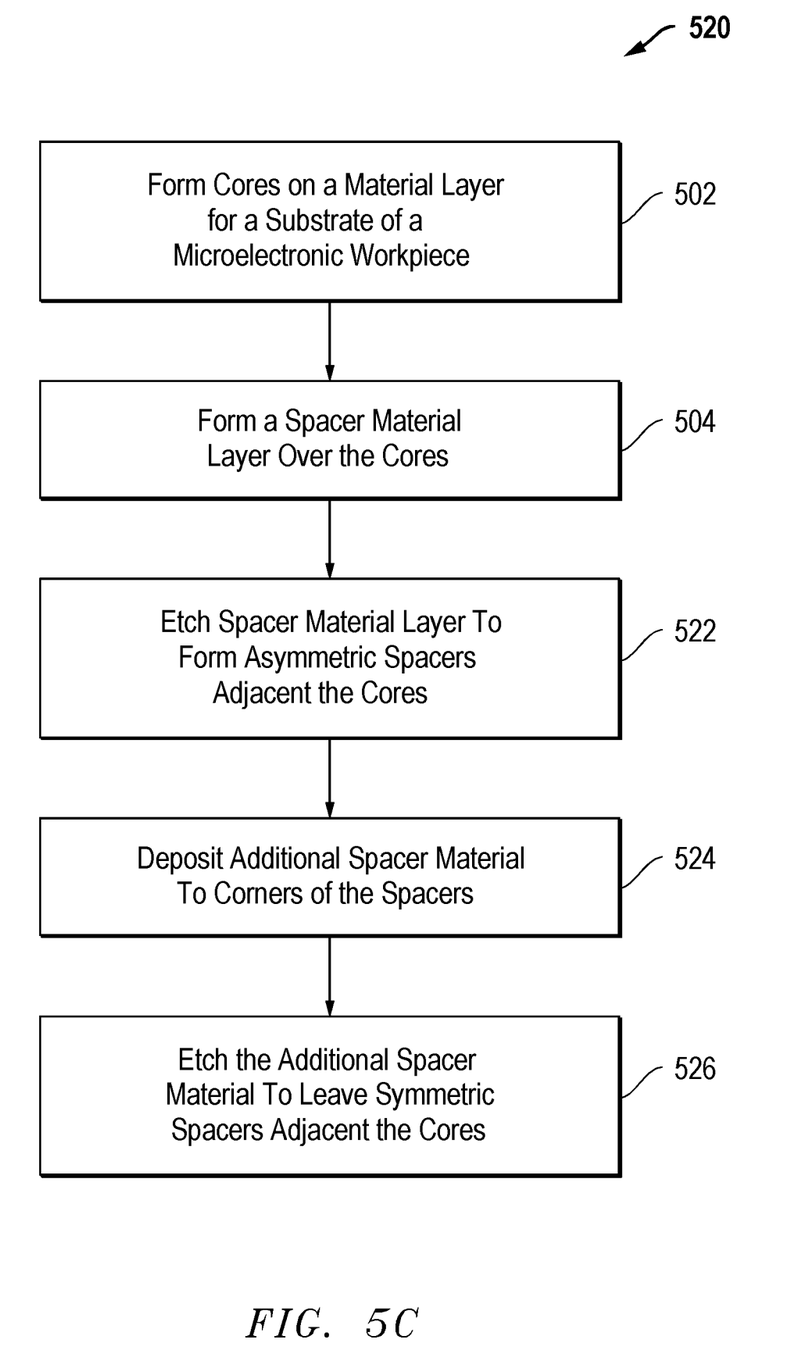
FIG. 5C is a process flow diagram of an example embodiment that provides reshaping of spacer profiles by depositing additional spacer material to corners of spacers using direction deposition processes.

FIG. 5C is a process flow diagram of an example embodiment 520 that provides reshaping of spacer profiles by depositing additional spacer material to corners of spacers using direction deposition processes. Blocks 502 and 504 are the same as in FIG. 5A. For block 502, cores are formed on a material layer for a substrate of a microelectronic workpiece. For block 504, a spacer material layer is formed over the cores. For embodiment 520, the symmetric spacers are formed in blocks 522, 524, and 526. In block 522, the spacer material layer is etched to form asymmetric spacers adjacent the cores. In block 524, additional spacer material is deposited to corners of the spacers using one or more directional deposition processes. In block 526, the additional spacer material is etched to leave symmetric spacers adjacent the cores. It is noted that additional and/or different steps could also be used while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to reshape spacer profiles, comprising:
   forming cores on a material layer for a substrate of a microelectronic workpiece;
   forming a spacer material layer over the cores; and
   forming symmetric spacers adjacent the cores by reshaping the spacer material layer using one or more directional deposition processes to deposit additional spacer material and using one or more etch process steps, wherein each of the symmetric spacers is symmetric about a line running through a central axis of each spacer, the spacer material layer and the additional spacer material are the same material, and the additional spacer material is not deposited on a horizontal surface between adjacent cores.

2. The method of claim 1, wherein the symmetric spacers are formed as part of a self-aligned multiple patterning (SAMP) process.

3. The method of claim 1, wherein the symmetric spacers are formed by:
   depositing, with the one or more directional deposition processes, additional spacer material to corners of the spacer material layer where the spacer material layer covers corners of the cores; and
   etching, with the one or more etch processes, the spacer material layer and the additional spacer material to leave symmetric spacers adjacent the cores.

4. The method of claim 3, wherein the corners of the spacer material layer are rounded corners.

5. The method of claim 1, wherein the symmetric spacers are formed by: etching the spacer material layer to form asymmetric spacers adjacent the cores;
   depositing, with the one or more directional deposition processes, additional spacer material to corners of the spacers; and
   etching, with the one or more etch processes, the additional spacer material to leave the symmetric spacers adjacent the cores.

6. The method of claim 5, wherein the corners of the asymmetric spacers have rounded corners.

7. The method of claim 1, further comprising using a planarization process at least in part to form the symmetric spacers.

8. The method of claim 1, wherein the one or more directional deposition processes comprise one or more oblique physical vapor deposition (PVD) processes.

9. The method of claim 8, wherein the one or more oblique PVD processes apply the additional spacer material at an angle of 30 to 60 degrees.

10. The method of claim 8, wherein the one or more oblique PVD processes apply the additional spacer material at an angle of 45 degrees.

11. The method of claim 8, wherein the one or more oblique PVD processes are used to deposit additional spacer material simultaneously in two different directions.

12. The method of claim 8, wherein a first set of one or more oblique PVD processes is used to deposit additional spacer material in a first direction and a second set of one or more oblique PVD processes is used to deposit additional spacer material in a second direction.

13. The method of claim 12, wherein oblique PVD processes from the first set are alternated with oblique PVD processes from the second set.

14. The method of claim 8, wherein a plurality of oblique physical vapor deposition (PVD) processes are used having at least one of a same process chemistry, a different process chemistry, or a combination thereof.

15. The method of claim 8, wherein a plurality of oblique physical vapor deposition (PVD) processes are used having at least one of a same target material, a different target material, or a combination thereof.

16. The method of claim 1, further comprising removing the cores to leave the symmetric spacers.

17. The method of claim 16, further comprising transferring a pattern for the symmetric spacers to the material layer.

18. The method of claim 17, wherein a target level of etch uniformity is achieved in the transferring of the pattern.

19. The method of claim 1, wherein the spacer material layer comprises at least one of an oxide or a nitride.

20. The method of claim 1, wherein the cores are formed from at least one of an organic planarization layer or an amorphous silicon layer.

21. The method of claim 1, wherein the spacer material layer is formed using atomic layer deposition.

22. The method of claim 1, wherein the symmetric spacers have matching surface etch levels.

23. The method of claim 1, wherein forming symmetric spacers adjacent the cores by reshaping the spacer material layer comprises forming symmetric spacers adjacent the cores by reshaping the spacer material layer using two directional deposition processes to deposit additional spacer material.

24. A method to reshape spacer profiles, comprising:
   forming a core on a material layer for a substrate of a microelectronic workpiece;
   forming a spacer material layer over the core; and
   forming a symmetric spacer adjacent the core by reshaping the spacer material layer using one or more directional deposition processes to deposit additional spacer material and using one or more etch process steps, wherein the symmetric spacer is symmetric about a line running through a central axis of the symmetric spacer, the spacer material layer and the additional spacer material are the same material, and the additional spacer material is not deposited.

25. The method of claim 24, wherein forming the symmetric spacer adjacent the cores by reshaping the spacer material layer comprises forming the symmetric spacer adjacent the cores by reshaping the spacer material layer using two directional deposition processes to deposit additional spacer material.

* * * * *

UNITED STATES PATENT AND TRADEMARK OFFICE
CERTIFICATE OF CORRECTION

PATENT NO. : 11,551,930 B2
APPLICATION NO. : 16/299623
DATED : January 10, 2023
INVENTOR(S) : Akiteru Ko et al.

It is certified that error appears in the above-identified patent and that said Letters Patent is hereby corrected as shown below:

In the Claims

Column 12, Line 64, Claim 24, "spacer material is not deposited." should read -- spacer material is not deposited on a horizontal surface between cores. --

Signed and Sealed this
Sixteenth Day of May, 2023

Katherine Kelly Vidal
*Director of the United States Patent and Trademark Office*